US009112455B2

(12) United States Patent
Momose et al.

(10) Patent No.: US 9,112,455 B2
(45) Date of Patent: Aug. 18, 2015

(54) SIGNAL AMPLIFYING CIRCUIT FOR ELECTROMAGNETIC FLOW METER

(71) Applicant: Azbil Corporation, Tokyo (JP)

(72) Inventors: Osamu Momose, Tokyo (JP); Ichiro Mitsutake, Tokyo (JP); Shinsuke Matsunaga, Tokyo (JP); Taka Inoue, Tokyo (JP); Masahide Ushiyama, Tokyo (JP)

(73) Assignee: AZBIL CORPORATION, Tokyo (JP)

( * ) Notice: Subject to any disclaimer, the term of this patent is extended or adjusted under 35 U.S.C. 154(b) by 0 days.

(21) Appl. No.: 14/217,650

(22) Filed: Mar. 18, 2014

(65) Prior Publication Data

US 2014/0266438 A1    Sep. 18, 2014

(30) Foreign Application Priority Data

Mar. 18, 2013  (JP) ................................. 2013-054635

(51) Int. Cl.
*H03F 3/45* (2006.01)
*H03F 1/30* (2006.01)
*G01F 1/60* (2006.01)

(52) U.S. Cl.
CPC .. *H03F 1/30* (2013.01); *G01F 1/60* (2013.01); *H03F 3/45071* (2013.01)

(58) Field of Classification Search
CPC ....................................................... H03F 3/45
USPC .................................................. 330/69, 252
See application file for complete search history.

(56) References Cited

U.S. PATENT DOCUMENTS

| 5,300,896 | A | * | 4/1994 | Suesserman | 330/260 |
| 5,625,320 | A | * | 4/1997 | Hagerty | 330/2 |
| 6,085,599 | A | | 7/2000 | Feller | |
| 6,577,187 | B1 | * | 6/2003 | Lesko | 330/11 |
| 2005/0104607 | A1 | | 5/2005 | Byington et al. | |
| 2011/0239778 | A1 | | 10/2011 | Mitsutake et al. | |

FOREIGN PATENT DOCUMENTS

| EP | 2 372 317 | 10/2011 |
| GB | 2 089 047 | 6/1982 |
| JP | H08-021756 A | 1/1996 |

OTHER PUBLICATIONS

European Search Report dated Jun. 26, 2014, which issued during prosecution of European Application No. 14155368.5.

* cited by examiner

*Primary Examiner* — Henry Choe
(74) *Attorney, Agent, or Firm* — Troutman Sanders LLP (57) ABSTRACT

In a signal amplifying circuit, a flow rate signal, inputted between flow rate signal input terminals of a connector, is inputted into one input terminal and the other input terminal of an instrumentation amplifier through resistive elements and subjected to differential amplification. The amplified output signal thereof is outputted to a sample hold circuit through a coupling capacitor. The flow rate signals, inputted between the flow rate signal input terminals, are buffered by buffer amplifiers, and output signals thereof are outputted to a fault detecting circuit. An interconnection, which connects one of the flow rate signal input terminals and a non-inverting input terminal of one of the buffer amplifiers, is guarded by a guard ring pattern. An interconnection, which connects the other one of the flow rate signal input terminals and a non-inverting input terminal of the other one of the buffer amplifiers, is guarded by another guard ring pattern.

4 Claims, 9 Drawing Sheets

Background Art

Background Art

Background Art

SIGNAL AMPLIFYING CIRCUIT FOR ELECTROMAGNETIC FLOW METER

CROSS REFERENCE TO RELATED APPLICATION

This application claims priority under 35 U.S.C. §119 to Japanese Patent Application No. 2013-054635, filed on Mar. 18, 2013, the entire content of which being hereby incorporated herein by reference.

FIELD OF TECHNOLOGY

The present invention relates to an electromagnetic flow meter, and, in particular, relates to a signal amplifying circuit technology for amplifying an electromotive force obtained from a detector.

BACKGROUND

Typically, in electromagnetic flow meters for measuring the flow rate of a fluid that is electrically conductive, the flow rate of the fluid that flows within a pipe is measured by providing a magnetic excitation electric current that alternatingly switches polarities to a magnetic excitation coil that is disposed so that the direction of the magnetic field that is produced is perpendicular to the direction of flow of the fluid that is flowing within the pipe, to detect and differentially amplify, using a signal amplifying circuit, the electromotive force that is produced between a pair of detector electrodes that are disposed within the pipe perpendicular to the magnetic field produced by the magnetic excitation coil, and sampling and performing signal processing on the flow rate signal that is produced. See, for example, Japanese Unexamined Patent Application Publication No. H08-021756.

At this time, having the magnetic excitation current be as large as possible produces a large flow rate signal, which can improve the measurement accuracy. However, because the ramp up of the magnetic excitation electric current is slow because of the inductance in the magnetic excitation coil, if the flow rate signal is to be sampled in a steady domain, the larger the electric current, the lower the magnetic excitation frequency must be. On the other hand, when the magnetic excitation frequency is reduced, the fluid noise (noise that has the property of being inversely proportional to the frequency) increases, and has an adverse effect on the signal-to-noise ratio. Because of this, in typical electromagnetic flow meters, a magnetic excitation frequency of between about ⅛ and ¼ of the commercial power supply frequency is used.

Moreover, in the signal amplifying circuit, the input impedance of the signal amplifying circuit must be as high as possible so as to not produce attenuation in the flow rate signal, even if the fluid that is being measured has low electrical resistivity. Moreover, so that the contact resistance of the detecting electrodes does not increase due to an insulating substance is adhering to the detecting electrodes through the occurrence of electrochemical reactions between the detecting electrodes in the pipe and the fluid interface, the DC electric current that flows from the signal amplifying circuit to the detecting electrode side, and the DC electric current that flows from the detecting electrodes into the signal amplifying circuit, must be as small as possible.

Figure 6:
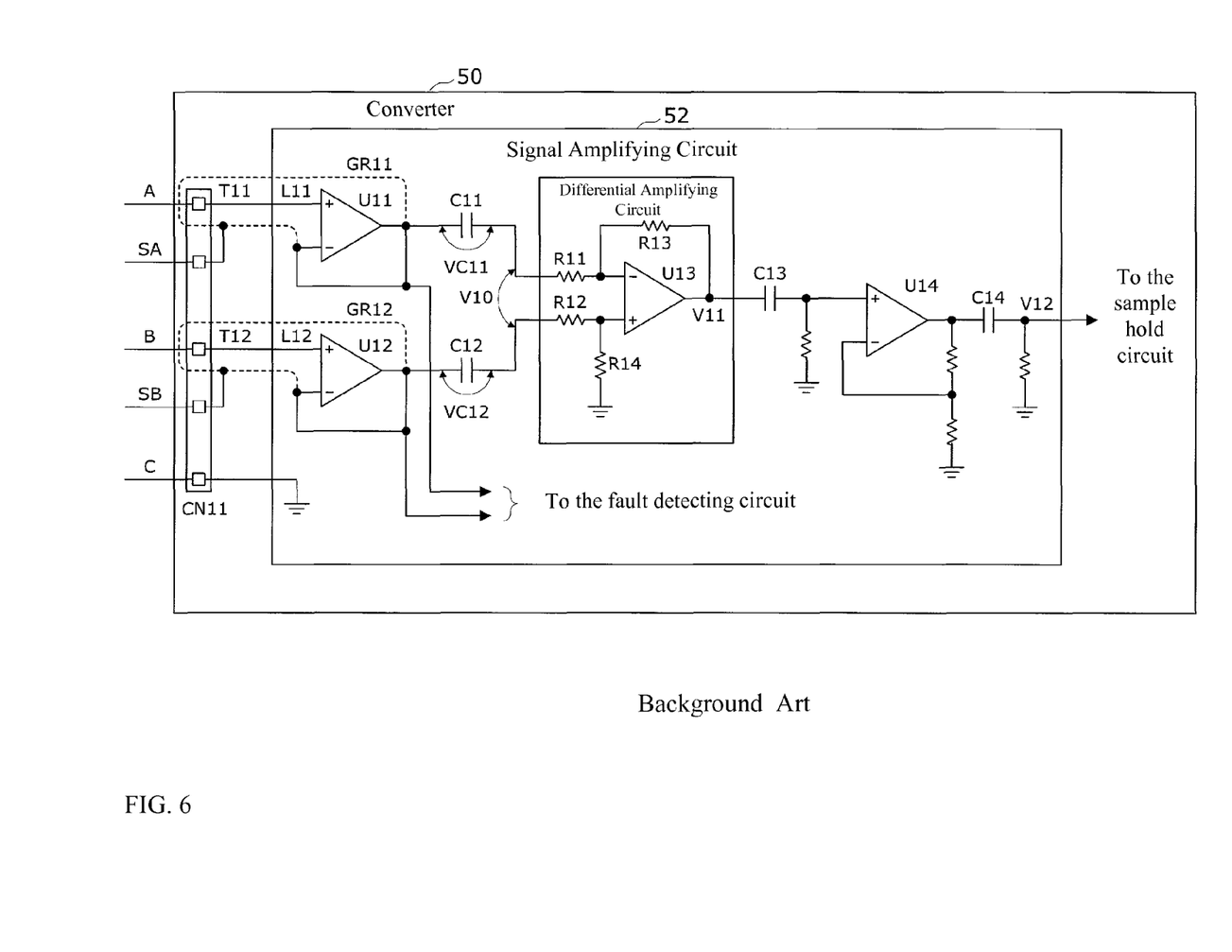
FIG. 6 is a conventional signal amplifying circuit.

FIG. 6 is a conventional signal amplifying circuit. Here, in a signal amplifying circuit 52 in a converter 50, the input impedance is increased through the preamplifiers U11 and U12 at the first stage. Moreover, the adherence of insulating substances through "electrochemical reactions between the detecting electrodes of the detector and the fluid interface," as mentioned above, are suppressed through the use of FET input-type operational amplifiers, with input bias currents that are as small as possible, for U11 and U12.

Moreover, although the input impedance of the FET-input operational amplifier is extremely high, and the input bias current is also extremely low, to that extent it becomes susceptible to the effects of noise produced by the peripheral circuitry, and the like. Moreover, when the insulating characteristics of the circuit board degrade due to the effects of ambient moisture or adhesion of contaminating particles, the input impedance will be reduced.

Because of this, the interconnection patterns L11 and L12 from the connector CN11 for connecting the signal cables to the non-inverting input terminals of U11 and U12 are surrounded by guard rings GR11 and GR12 by the interconnection patterns for the output terminals of U11 and U12 (which are at the same electropotential as the input signals and which have low impedance), so as to prevent adverse effects of the peripheral circuitry and to prevent adverse effects of any degradation in the insulating properties of the circuit board.

Figure 7:
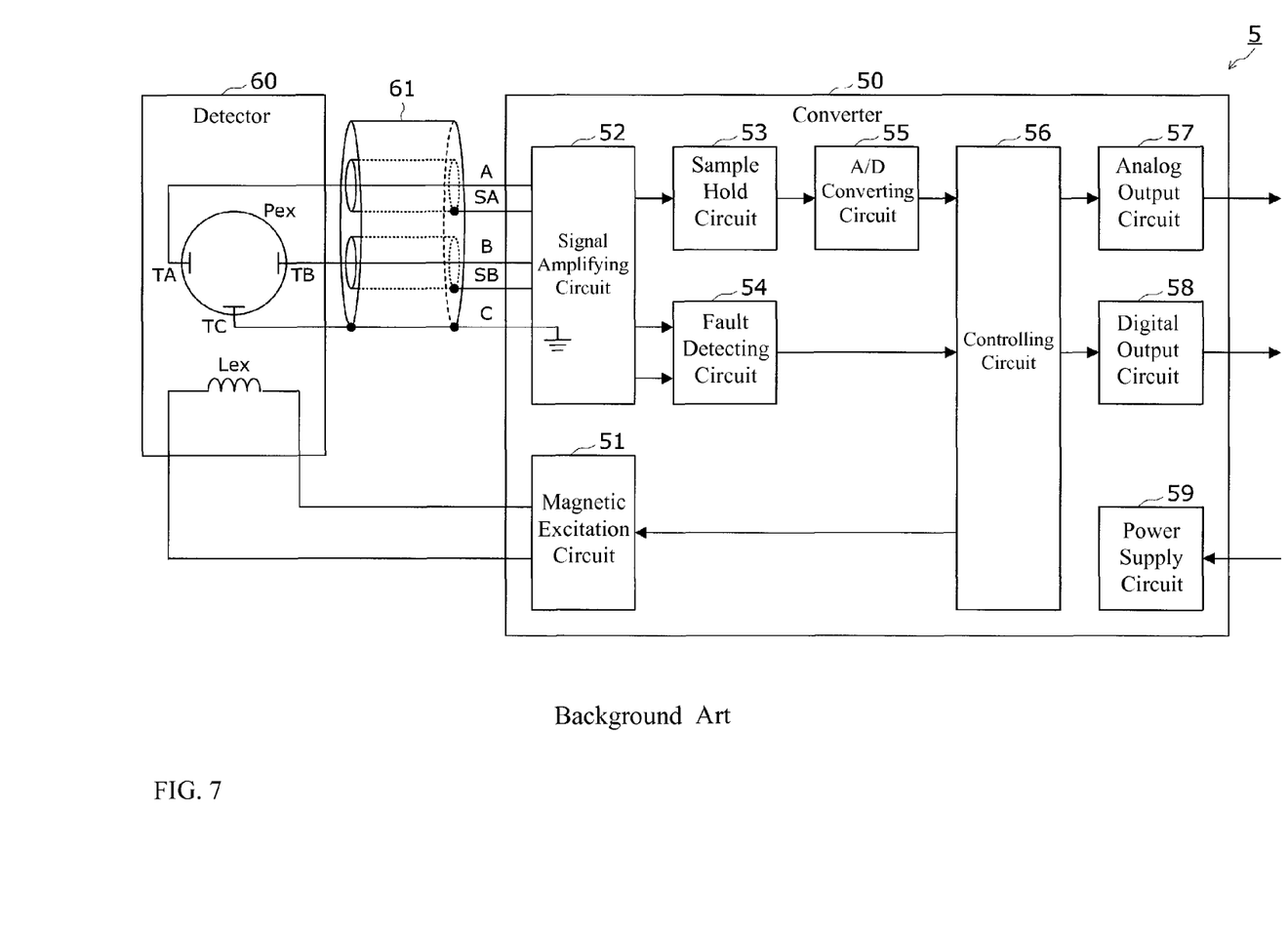
FIG. 7 is a block diagram illustrating the structure of a conventional electromagnetic flow meter.

FIG. 7 is a block diagram illustrating a configuration for a conventional electromagnetic flow meter. When a detector 60 is of a discrete type and is disposed at a location that is away from the converter 50, the detector 60 and the converter 50 are connected by a double-shielded line 61, as illustrated in FIG. 7. In this case, attenuation of the flow rate signal due to the capacitance between lines is prevented through applying the same voltage as the guard ring in FIG. 6, described above, to the inside shield lines SA and SB.

Moreover, the outputs of U11 and U12 in FIG. 6 are connected also to a fault detecting circuit 54 of FIG. 7, where if there ceases to be fluid within the pipe Pex so that the detecting electrodes TA and TB of the detector 60 cease to contact the fluid, or if a signal line in the detector 60 breaks or becomes disconnected, or the like, or if the output levels of U11 and U12 otherwise go outside of the normal range, the controlling circuit 56 is notified that there is a fault in the input signal. In response, the controlling circuit 56 performs fault handling through turning ON an alarm output from a digital output circuit 58, and sets the output level of an analog output circuit 57 to a level for when a fault is detected.

In such conventional technology, an input offset voltage for the buffer amplifiers U11 and U12 has thermal characteristics (offset voltage temperature drift) of about several mV/1° C., even in the high precision type, where this DC component is outputted from U11 and U12. These thermal characteristics are different from unit to unit, and when they are inputted as-is in to the differential amplifying circuits of the next stage, then the differences in the thermal characteristics between U11 and U12 will be amplified, rather than canceled, producing a temperature-based drift in the measurement value for the flow rate. Because typically the flow rate signal level is about 200 µV p-p per 1 m/s in the flow rate, this cannot be ignored.

Because of this, in the conventional technology the DC component of the outputs of U11 and U12 are cut through inserting coupling capacitors C11 and C12 into the input side of the differential amplifying circuits. However, there is a problem in that the coupling capacitors C11 and C12 have an adverse effect on the common-mode rejection ratio (hereinafter termed "CMRR") in the differential amplifiers, and causes recovery from an anomalous input to be slow.

Adverse Effect on CMRR

The adverse effect on the CMRR in the differential amplifying circuits will be explained first.

The purpose for a differential amplifying circuit is to amplify the flow rate signal while rejecting the common-mode noise component that is superimposed on the flow rate signal. However, even though, in FIG. 6, an operational amplifier that has a high CMRR when it is by itself is used for U13, the CMRR in a differential amplifying circuit is also affected greatly by the matching of the resistive element R11 that connects between the inverting input of the differential amplifying circuit and the inverting input terminal of U13 and the resistive element R12 that connects between the non-inverting input of the differential amplifying circuit and the non-inverting input terminal of U13, the matching between the resistive element R13 that connects between the inverting input terminal and the output terminal of U13 and the resistive element R14 that connects between the non-inverting input terminal of U13 and the ground electropotential, and also the matching between the coupling capacitors C11 and C12.

Moreover, in the circuit structure in FIG. 6, the effective resistance of C11, R11, and R13, and the effective resistance of C12, R12, and R14, each form high-pass filters. As a result, if the time constants are not adequately large when compared to the magnetic excitation frequency (=signal frequency) so as to not lose the signal frequency component, the amplitude of the signal waveform will be attenuated. Because of this, it is necessary for C11 and C12 to have large capacitances of at least several tens of µF.

Figure 8:
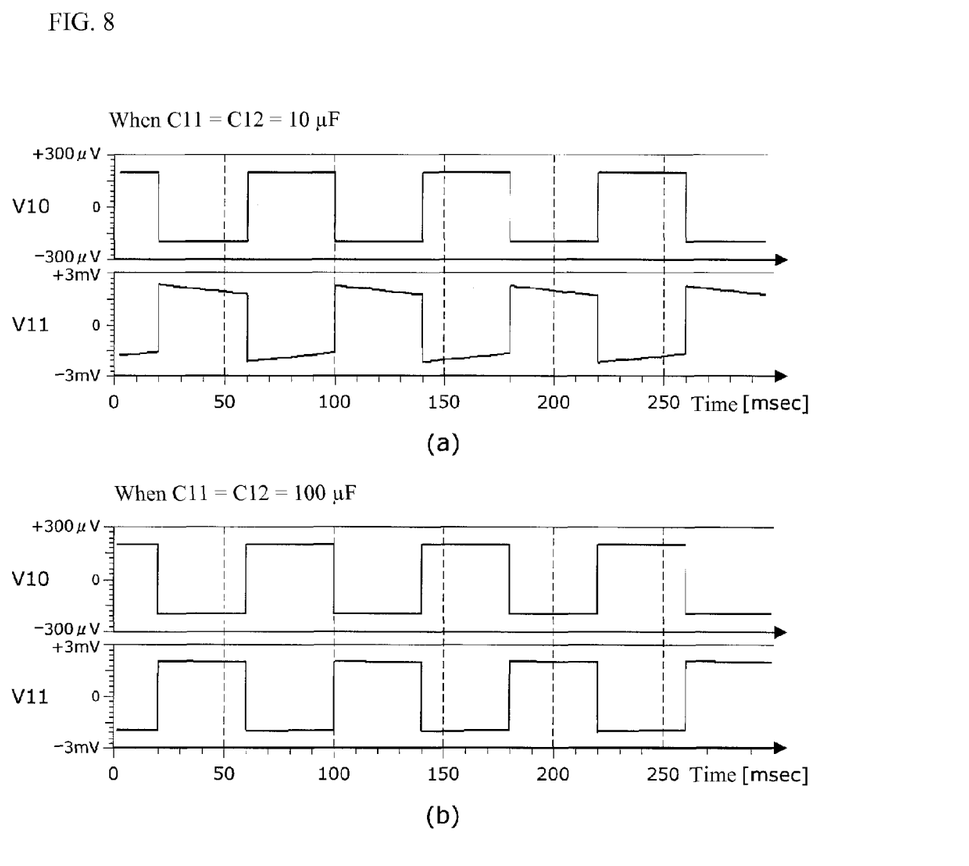
FIG. 8 is a signal waveform diagram illustrating the inputs and outputs of a conventional differential amplifying circuit.

FIG. 8 is a signal waveform diagram illustrating the inputs and outputs of a conventional differential amplifying circuit.

For example, when the magnetic excitation frequency=12.5 Hz, R11=R12=10 kΩ, and R13=R14=100 kΩ (where the differential amplification gain is 10×) in the circuit in FIG. 6, if C11=C12=100 µF, then, as illustrated in FIG. 8($b$), the flow rate signal can be amplified with essentially no smoothing of the waveform.

On the other hand, with C11=C12=10 µF, then, as in FIG. 8($a$), the output voltage waveform V11 of U13 will be smoothed. In this way, any slight differences in temperature characteristics between C11 and C12 when sampling a smoothed waveform will have a large effect on the measured value for the flow rate.

Because of this, tantalum electrolytic capacitors, which have relatively good temperature characteristics, are used for the coupling capacitors C11 and C12. While multilayer ceramic capacitors (of the temperature compensating type), which have excellent capacitive precision, may be considered, but they cannot be used because they are only manufactured up to about 0.1 µF.

However, the accuracy of the capacitance of tantalum electrolytic capacitors is no more than about ±10%, at best, so mismatching between C11 and C12 is unavoidable. In particular, the impedances of C11 and C12 gets large on the low-frequency side, so the amount of the impedance mismatch becomes large as well, having an adverse effect on the CMRR of the differential amplifying circuits. Because of this, if there is a common-mode noise component in the low-frequency domain, it cannot be rejected adequately, which will cause drift in the measured value for the flow rate. Moreover, while the stability can be improved by performing a smoothing process in software for this drift, the responsiveness would suffer commensurately.

Note that if the effective resistance of R11 and R13, and the effective resistance of R12 and R14, are made large, then the impedances of C11 and C12 will be relatively small, thus making it possible to ameliorate the adverse effect of mismatch between C11 and C12 on the CMRR; however, when these values are made large, then the thermal noise due to the resistance will increase, which will have an adverse effect on the signal-to-noise ratio of the output signal. Because of this, the effective resistance must be kept to no more than about several kΩ.

Moreover, even when the signal level is adequately large so that any adverse effect on the signal-to-noise ratio due to thermal noise is not a problem, still it is necessary to maintain the matching between R11 and R12, and the matching between R13 and R14, even when the effective resistances are large, and because resistors that have both high resistance and high accuracy are not manufactured, it would be necessary to create the high resistance with high accuracy by connecting multiple low-resistance high-accuracy resistors in series, which would result in increased costs.

Slow Recovery from Anomalous Inputs

The slow recovery from anomalous inputs will be explained next.

When the fluid within the pipe goes to empty so that the detecting electrodes of the detector no longer contact the fluid, or when a signal line in the detector is broken or disconnected, or when noise beyond the tolerable input voltage range is superimposed on the input signal, or the like, flow rate measurement would become impossible, and thus the input signal fault procedure described above is performed; however, once the input signal has returned to normal thereafter, the flow rate measurement must be restarted as soon as possible.

At this time, when the gain of the differential amplifying circuit through U13, in the circuit in FIG. 6, is large, then the time for recovery from a saturated output state of U13 will be long because of the effects of the voltages with which the coupling capacitors C11 and C12 are charged, and thus the gain of U13 must not be too large. Because of this, an amplifying circuit through U14 is inserted into a subsequent stage, to divide into multiple stages, to perform amplification that enables sampling and holding at the latter stage, and to perform A/D conversion.

For example, if the pipe becomes empty and thereafter is returned to a state wherein it is filled with water, then, as illustrated in FIG. 7, if the detecting electrodes of the detector are disposed so as to be perfectly level of each other, a s shown in FIG. 7, the detecting electrode TA and the detecting electrode TB would contact the fluid simultaneously, but if disposed so as to be inclined, then the detecting electrode TB would contact the fluid first, and the detecting electrode TA would contact the fluid thereafter, producing a shift in the timing of the contact with the fluid.

Figure 9:
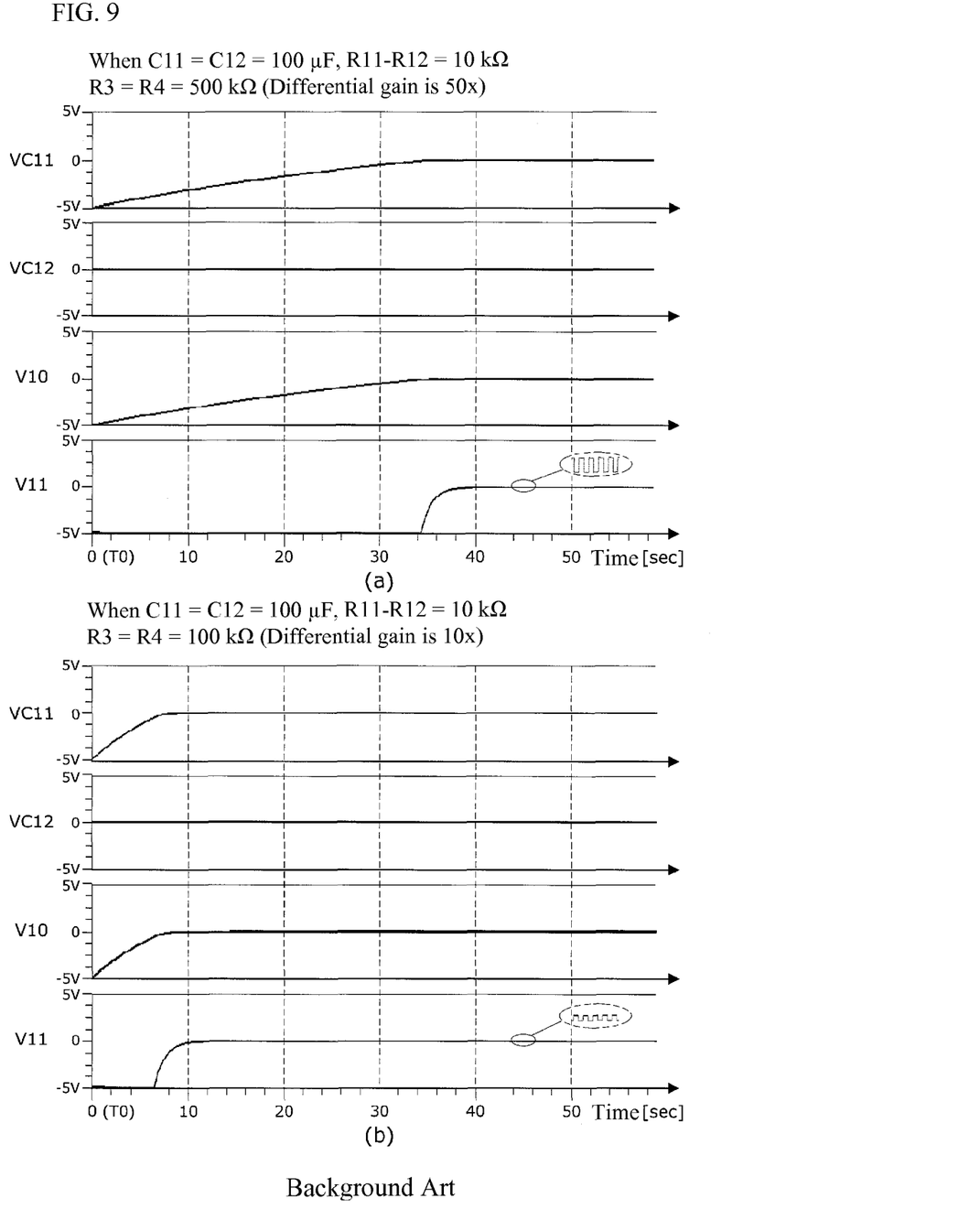
FIG. 9 is a signal waveform diagram illustrating the operation of the differential amplifying circuit of FIG. 6.

FIG. 9 is a signal waveform diagram illustrating the operation of the differential amplifying circuit of FIG. 6, where ($a$) is when the gain is 50× and ($b$) is when the gain is 10×. Note that here the power supply voltage is ±5 V, and U11 through U13 are of the rail-to-rail input/output type.

In both FIGS. 9($a$) and ($b$), in the interval prior to time mark T0, the detecting electrode TA is in a state wherein it is not in contact with the fluid (a high impedance state), and because the A terminal is lowered to the negative-side power supply voltage level by the input bias current of U11, the output of U11 will be in the saturated state on the negative side (−5 V), so the voltages VC11 on both ends of C11 will be charged to −5 V.

Moreover, if the detecting electrode TA is restored from the non-contact state to a state wherein it contacts the fluid at time mark T0, then a normal signal will be inputted into U11 from the detecting electrode TA, to return the output voltage of U11 from −5 V correctly to ±100 µV (half of the signal amplitude). At this time, the input voltage V10 of the differential amplifying circuit will be at about −5 V due to the voltage VC11 with which C11 is charged, so the output voltage V11 will be in a saturated state (−5 V) on the negative side.

While thereafter the voltage that has been charged into C11 is discharged through the series resistances of R11 and R13, for the case of the gain of 50× in FIG. 9(a), the discharging of C11 will take time commensurate with the magnitude of the resistance value of R13, and additionally, because the gain is high as well, returning from the state wherein the output is saturated to a state wherein it is possible to perform the measurements properly will take about 40 seconds.

On the other hand, in the case wherein the gain is 10×, in FIG. 9(b), the resistance value of R13 is small, so C11 is discharged quickly, and because the gain is also small, recovery from the state wherein the output is saturated to a state wherein the measurement can be performed properly will take about 10 seconds.

Consequently, because the amount of time until measurements can be performed properly becomes long when the differential amplification gain of U13 is large, it has been necessary to divide the amplifying circuit into a plurality of stages, and to insert coupling capacitors C13 and C14, as in FIG. 6, for example, at the outputs of the respective amplifiers, to cut the DC component caused by the offset voltage.

As described above, even though it is possible to return to normal operation after the input signal has been at an aberrant value in the signal amplification circuit, these capacitors C11 and C12 cause the recovery of the output signal to be slow, delaying restarting of the flow rate measurement.

The present invention is to solve such a problem, and an aspect thereof is to provide a signal amplifying circuit technology for an electromagnetic flow meter wherein it is possible to avoid a reduction in the CMRR in the differential amplifying circuit and to avoid slow recovery after an aberrant input, which are caused by the coupling capacitors.

SUMMARY

In order to achieve such an aspect, a signal amplifying circuit according to the present invention is a signal amplifying circuit used in an electromagnetic flow meter, for measuring a flow rate of a fluid that flows in a pipe, through sampling, with a sample hold circuit, after differential amplification has been performed by a signal amplifying circuit, a flow rate signal that is detected by a pair of detecting electrodes that are disposed within the pipe, and inputted through first and second flow rate signal input terminals, and for detecting, through a fault detecting circuit, a fault in the flow rate signal based on the output signal obtained from the signal amplifying circuit. The signal amplifying circuit includes: a single-chip-type instrumentation amplifier with an FET input, with one input terminal connected to the first flow rate signal input terminal, and the other input terminal connected to the second flow rate signal input terminal, which outputs, to the sample hold circuit from the output terminal, an amplified output signal obtained through performing differential amplification on the flow rate signal; a first buffer amplifier wherein a non-inverting input terminal is connected to the first flow rate signal input terminal, and the inverting input terminal is connected to its own output terminal, which outputs, from the output terminal to the fault detecting circuit, a first output signal that is produced; a second buffer amplifier wherein a non-inverting input terminal is connected to the second flow rate signal input terminal, and the inverting input terminal is connected to its own output terminal, which outputs, from the output terminal to the fault detecting circuit, a second output signal that is produced; a first guard ring pattern that is connected to an output terminal of the first buffer amplifier, formed on the circuit board so as to encompass a first interconnection pattern, on the circuit board, that connects the first flow rate signal input terminal and the non-inverting input terminal of the first buffer; and a second guard ring pattern that is connected to an output terminal of the second buffer amplifier, formed on the circuit board so as to encompass a second interconnection pattern, on the circuit board, that connects the second flow rate signal input terminal and the non-inverting input terminal of the second buffer.

In one example configuration of the signal amplifying circuit as set for above: in the instrumentation amplifier, one input terminal is connected through a first resistive element to the first flow rate signal input terminal and the other input terminal is connected through a second resistive element to the second flow rate signal input terminal; the first guard ring pattern is formed encompassing the periphery of the first interconnection pattern, passing under the first resistive element, which is mounted on the circuit board; and the second guard ring pattern is formed encompassing the periphery of the second interconnection pattern, passing under the second resistive element, which is mounted on the circuit board.

Moreover, another signal amplifying circuit according to the present invention is a signal amplifying circuit used in an electromagnetic flow meter, for measuring a flow rate of a fluid that flows in a pipe, through sampling, with a sample hold circuit, after differential amplification has been performed by a signal amplifying circuit, a flow rate signal that is detected by a pair of detecting electrodes that are disposed within the pipe, and inputted through first and second flow rate signal input terminals, and for detecting, through a fault detecting circuit, a fault in the flow rate signal based on the output signal obtained from the signal amplifying circuit. The another signal amplifying circuit includes: a single-chip-type instrumentation amplifier with an FET input, with one input terminal connected to the first flow rate signal input terminal, and the other input terminal connected to the second flow rate signal input terminal, which outputs, to the sample hold circuit into the fault detecting circuit from the output terminal, an amplified output signal obtained through performing differential amplification on the flow rate signal; a buffer amplifier wherein a non-inverting input terminal is connected to the first flow rate signal input terminal, and the inverting input terminal is connected to its own output terminal, which outputs, from the output terminal to the fault detecting circuit, a output signal that is produced; and a guard ring pattern that is connected to an output terminal of the buffer amplifier, formed on the circuit board so as to encompass a first interconnection pattern, on the circuit board, that connects the first flow rate signal input terminal, the non-inverting input terminal of the first buffer, and one input terminal of the instrumentation amplifier, and so as to encompass a second interconnection pattern, on the circuit board, that connects the second flow rate signal input terminal and the other input terminal of the instrumentation amplifier.

In another example configuration of the signal amplifying circuit as set for above: in the instrumentation amplifier, one input terminal is connected directly to the first flow rate signal input terminal, and the other input terminal is connected directly to the second flow rate signal input terminal; and the first guard ring pattern is formed encompassing the periphery of the first and second interconnection pattern, passing under the instrumentation amplifier, which is mounted on the circuit board.

The present invention enables a flow rate signal from an instrumentation amplifier to undergo differential amplification and to be outputted to a sample hold circuit of a later stage without the use of an output signal from a buffer amplifier in flow rate measurement. Because of this, it is possible to avoid the effect of the buffer amplifier offset voltage drift on the flow rate measurement, and to eliminate the coupling capacitors for suppressing the offset voltage drift, through the circuit structure described above, wherein the functions of the buffer amplifier and the instrumentation amplifier are separated.

Consequently, it is no longer necessary to provide the coupling capacitors at the input stage of the differential amplifying circuit, as it has been conventionally and possible to avoid the adverse effect on CMRR that is caused by mismatching of the coupling capacitors, and thus possible to achieve an extremely excellent CMRR. Moreover, because there is no need to provide a coupling capacitor in the input stage of the differential amplifying circuit, when the input signal has returned to normal from an anomalous value, there is no delay in the amplified output signal of the instrumentation amplifier returning to normal, as would be caused by these coupling capacitors, making it possible to recover the amplified output of the instrumentation amplifier immediately from the saturated state in response to the input signal being restored from the anomalous signal. As a result, it is possible to restart the flow rate measurements extremely quickly after the input signal has returned to normal, thus enabling an improvement in the response performance of the electromagnetic flow meter.

DETAILED DESCRIPTION

Figure 1:
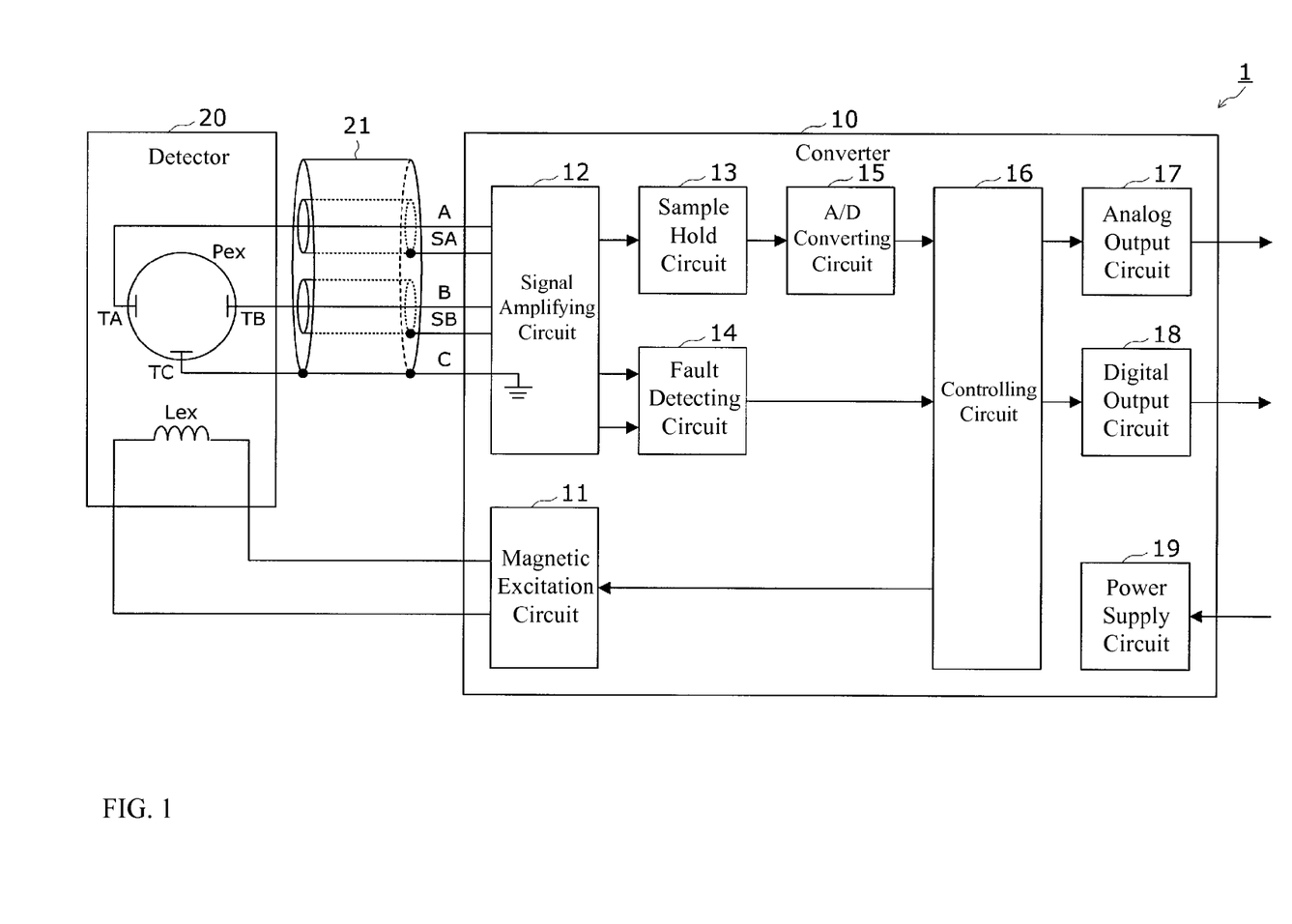
FIG. 1 is a block diagram illustrating the structure of an electromagnetic flow meter according to Example.
Figure 2:
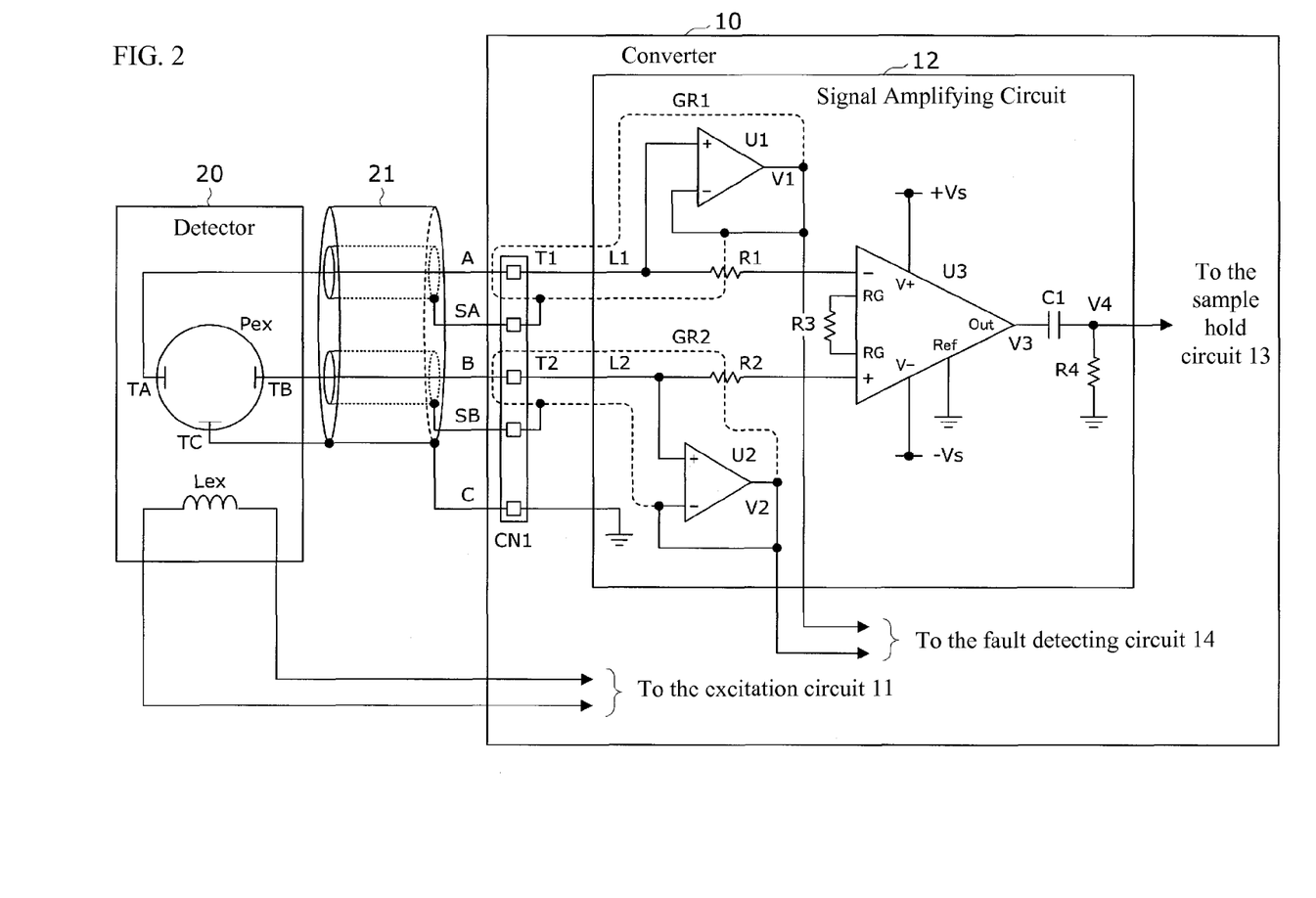
FIG. 2 is a circuit diagram illustrating a signal amplifying circuit according to the Example.

Forms for carrying out the present invention will be explained next in reference to the figures.
Example
A signal amplifying circuit 12 in an electromagnetic flow meter 1 according to Example according to the present invention will be explained first referencing FIG. 1 and FIG. 2. FIG. 1 is a block diagram illustrating a structure of an electromagnetic flow meter according to the Example. FIG. 2 is a circuit diagram illustrating a signal amplifying circuit according to the Example.

This electromagnetic flow meter 1 is structured from a converter 10 and a detector 20 and has a function for measuring the flow rate of a fluid that has electrical conductivity.

The detector 20 is provided with a pipe Pex wherein flows the fluid that is subject to the flow rate measurement, and a magnetic excitation coil Lex for magnetically exciting the fluid within Pex.

The converter 10 has, as its primary circuit portions, a magnetic excitation circuit 11, a signal amplifying circuit 12, a fault detecting circuit 14, a sample hold circuit 13, an A/D converting circuit 15, a controlling circuit (CPU) 16, an analog output circuit 17, a digital output circuit 18, and a power supply circuit 19. These circuit portions are structured from electronic components that are mounted on a circuit board and interconnection patterns that are formed on the circuit board.

At the time of a measurement, first a magnetic excitation electric current wherein the polarity switches alternatingly is applied from a magnetic excitation circuit 11 to a magnetic excitation coil Lex that is disposed so that the direction in which the magnetic field is produced is perpendicular to the direction of flow of the fluid within the pipe Pex of the detector 20. Doing so causes the production of an electromotive force between a pair of detecting electrodes TA and TB that are disposed in the pipe Pex perpendicular to the magnetic field that is produced by the magnetic excitation coil Lex, where this electromotive force is inputted into the signal cable connector CN1 of the converter 10 through the double-shielded wire 21.

A pair of shielded lines SA and SB are contained within the double shielded line 21 that connects the detector 20 and the converter 10, where the flow rate signal is inputted into a flow rate signal input terminal (a first flow rate signal input terminal) T1 and a flow rate signal input terminal (a second flow rate signal input terminal) T2 of the CN1, through signal lines A and B within these SA and SB. Moreover, a shield C of the double shielded line 21 is connected to the ground electrode TC that is disposed within the pipe Pex, and connected also to a ground electropotential of the signal amplifying circuit 12 through CN1.

The signal amplifying circuit 12 performs differential amplification on the flow rate signal that has been inputted from T1 and T2 of CN1, and outputs the result.

Thereafter, a sample hold circuit 13 samples the amplified output signal from the signal amplifying circuit 12, and an A/D converting circuit 15 performs A/D conversion on the sampling result.

The controlling circuit 16 performs a calculation process on the A/D-converted value obtained from the A/D converting circuit 15, to calculate a flow rate measured value for the fluid that flows in the pipe, and sends the measurement result to a higher-level device from the analog output circuit 17 or the digital output circuit 18.

A power supply circuit 19 produces and supplies various types of operating power supplies from a power supply that is provided from the higher-level device or from an external power supply.

As illustrated in FIG. 2, the signal amplifying circuit 12 has, as its primary circuit portions, buffer amplifiers U1 and U2, and an instrumentation amplifier U3.

The buffer amplifier (a first buffer amplifier) U1 is made from an FET input-type operational amplifier, where the non-inverting input terminal is connected to T1 and the inverting input terminal is connected to the output terminal of the operational amplifier, and has the function of outputting the output signal that is obtained (the first output signal) V1 from the output terminal to a fault detecting circuit 14.

The buffer amplifier (a second buffer amplifier) U2 is made from an FET input-type operational amplifier, where the non-inverting input terminal is connected to T2 and the inverting input terminal is connected to the output terminal of the operational amplifier, and has the function of outputting the output signal that is obtained (the second output signal) V2 from the output terminal to the fault detecting circuit 14.

The instrumentation amplifier U3 is structured from a differential amplifier such as an instrumentation amplifier that is commonly used for industrial purposes and instrumentation, where the non-inverting input terminal (−) is connected to T1 through a resistive element (a first resistive element) R1, and the non-inverting input terminal (+) is connected to T2 through a resistive element (a second resistive element) R2, where differential amplification is performed on the flow rate signals that are inputted into the inverting input terminal and the non-inverting input terminal, and has the function of outputting the amplified output signal V3 that is produced from the output terminal (Out), at a single end, with the electropotential at the reference terminal (Ref) as a reference electropotential.

Moreover, as with U1 and U2, the inverting input terminal and the non-inverting input terminal of U3 are of the FET input type, so the input impedances are extremely high and the input bias current is extremely small. Because of this, even though the input terminal of U3 is connected to T1 and T2 (through R1 and R2), this produces no attenuation of the flow rate signal when measuring a fluid wherein the electrical conductivity is low, as was described above, and is able to suppress also the adhesion of insulating substances to the detecting electrodes through electrochemical reactions.

Moreover, U3 is a single-chip instrumentation amplifier, where matching of the internal operational amplifiers and the internal resistances is performed in the manufacturing process, making it easy to produce substantially better CMRR characteristics than when structuring an instrumentation amplifier through a plurality of operational amplifiers and external resistances.

The output terminal of U3 is connected to one end of the coupling capacitor C1, where the other end of C1 is connected through a resistive element R4 to the ground electropotential, and also connected to the sample hold circuit 13. Note that the resistive element R3 that is connected between the RG terminals of U3 is a resistive element for setting the amplification rate (the gain) of U3.

A guard ring pattern (a first guard ring pattern) GR1 is connected to the output terminal of U1, and is formed on the circuit board so as to encompass the periphery of the interconnection pattern (a first interconnection pattern) L1 that is on the circuit board, connecting T1 and the non-inverting input terminal of U1.

A guard ring pattern (a second guard ring pattern) GR2 is connected to the output terminal of U2, and is formed on the circuit board so as to encompass the periphery of the interconnection pattern (a second interconnection pattern) L2 that is on the circuit board, connecting T2 and the non-inverting input terminal of U2.

The guard ring patterns are interconnection patterns that are formed so as to encompass a high impedance interconnection pattern with an interconnection pattern that is of the same electropotential as the high impedance interconnection pattern, but having low impedance. This guard ring pattern is able to suppress the effects of leakage current and noise from other interconnection patterns that are formed near to the high impedance interconnection pattern, and able to suppress adverse effects of degradation of the insulating properties of the circuit board.

In FIG. 2, L1 and L2 are both high impedance interconnection patterns. Because of this, GR1 and GR2 are formed surrounding L1 and L2, and GR1 and GR2 are connected to output terminals of U1 and U2, which have the same electropotentials as L1 and L2, but with a low impedance, so as to guard L1 and L2, to suppress the effects of other interconnection patterns and the effects of degradation in the insulating characteristics of the circuit board.

Figure 3:
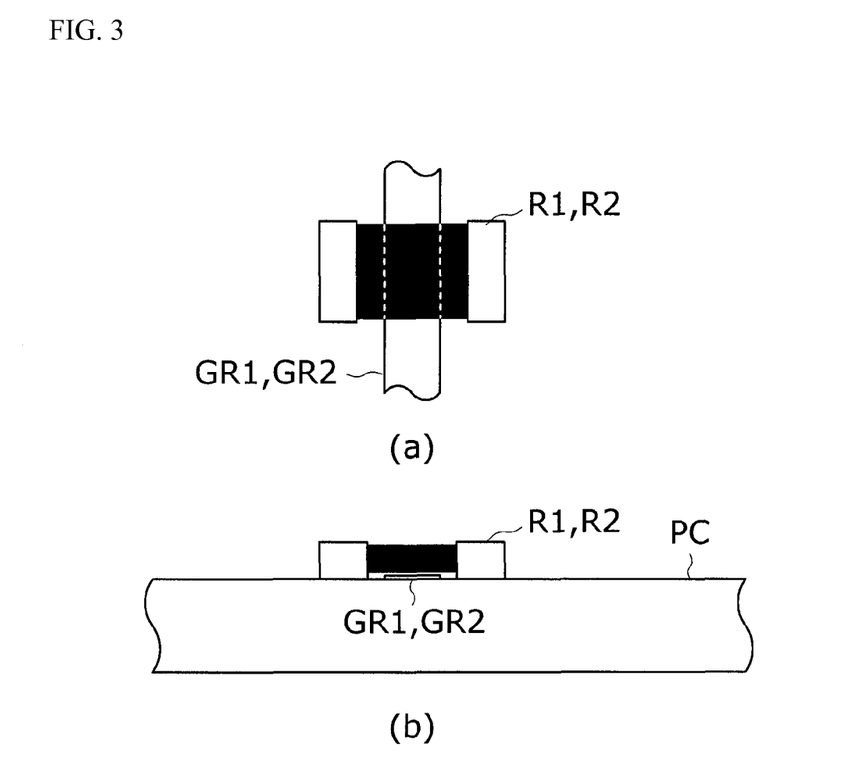
FIG. 3 is an example of formation of a guard ring pattern that uses a resistive element.

FIG. 3 is an example of formation of a guard ring pattern that uses a resistive element, where (a) is a plan view diagram and (b) is a front view diagram.

When L1 and L2 are guarded by GR1 and GR2, GR1 and GR2 must cut across the interconnection patterns that connect from L1 and L2 to U3. As illustrated in FIG. 2, this interconnection pattern is connected to the input terminal of U3 through a parallel connection of R1 and R2. Consequently, GR1 and GR2 may be formed on the circuit board PC under R1 and R2 so as to be hidden under R1 and R2 that are mounted on the circuit board PC.

As a result, although it would be difficult to pass GR1 and GR2 between the pins of U3 due to the narrow spacing between pins when a surface mount package is used for U3, because R1 and R2 pass thereunder, GR1 and GR2 can be formed easily in the vicinity of L1 and L2.

At this time, by disposing R1 and R2 in close proximity to the input terminals of U3 it is possible to minimize the effects of the degradation of the insulating properties of the circuit board and the effects from other interconnection patterns, even for an input terminal for U3 that has high impedance that is the same as for L1 and L2.

Moreover, R1 and R2 are resistive elements for input protection, where in combination with the input guard diodes that are built into U3, they can prevent damage to U3 through an overly large input voltage. At this time, the matching of the resistance values of R1 and R2 have essentially no effect on the CMRR of U3. However, if the resistance values for R1 and R2 are too large, then the signal-to-noise ratio for the output voltage of U3 may suffer due to heating noise produced by R1 and R2, and thus preferably the values of R1 and R2 are no more than about several kΩ.

Note that if there are concerns regarding the application of an excessively high input voltage into U3, then rather than using R1 and R2, a jumper resistance of zero Ω, rather than R1 and R2, may be used if T1 and T2 are connected directly to the inverting input terminal and the non-inverting input terminal of U3. Moreover, a choke coil may also be used instead of R1 and R2, which would serve also as a high-frequency noise countermeasure.

Moreover, the shields for SA and SB within the double-shielded line 21 are connected respectively to GR1 and GR2 through CN1. As a result, not only are L1 and L2 on the circuit board, but the signal lines A and B within SA and SB are also guarded by the respective shields that exhibit the same function as the guard patterns, making it possible to suppress the attenuation of the flow rate signal due to capacitance between lines and to suppress the effects of external noise.

Operation of the Example

FIG. 2 will be referenced next to explain the operation of the signal amplifying circuit 12 according to the present example.

The flow rate signals that are inputted between T1 and T2 of CN1 are inputted into the non-inverting input terminal and the inverting input terminal of U3 through R1 and R2 and subjected to differential amplification, and then outputted to the sample hold circuit 13 through C1.

Moreover, the flow rate signals that are inputted between T1 and T2 of CN1 are buffered by U1 and U2, and the output signals V1 and V2 thereof are outputted to the fault detecting circuit 14.

As a result, it is possible to perform differential amplification on the flow rate signals using U3, to output them to a sample hold circuit 13 in a subsequent stage, without using V1 and V2 from U1 and U2 in the flow rate measurement.

Because of this, the circuit structure set forth above wherein the functions are separated for U1 and U2 versus U3 makes it possible to avoid adverse effects on the flow rate measurement from the offset voltage drift in U1 and U2, and to eliminate the coupling capacitors for suppressing the offset voltage drift.

Consequently, it is no longer necessary to provide the coupling capacitors at the input stage of the differential amplifying circuit, as it has been conventionally and possible to avoid the adverse effect on CMRR that is caused by mismatching of the coupling capacitors, and thus possible to achieve an extremely excellent CMRR. In particular, U3 is a single-chip instrumentation amplifier, where matching of the internal operational amplifiers and the internal resistances is performed in the manufacturing process, making it easy to produce substantially better CMRR characteristics than when structuring an instrumentation amplifier through a plurality of operational amplifiers and external resistances. Moreover, mismatching of the input guard resistances R1 and R2 has essentially no effect on the CMRR. Moreover, having R1 and R2 be no more than several kΩ prevents the thermal noise of R1 and R2 from having an adverse effect on the signal-to-noise ratio of the output signal from U3.

Moreover, because it is not necessary to provide coupling capacitors at the input stage of the differential amplifying circuit, there will be no delay in the amplified output signal of U3 returning to normal, caused by such coupling capacitors, after an input signal has returned to normal from an aberrant value, making it possible to return also the amplified output signal of U3 immediately from the saturated state in response to the input signal returning to the normal state. This makes it possible to restart the flow rate measurements extremely quickly after the input signal has returned to normal, providing an improvement in the response performance of the electromagnetic flow meter 1. Moreover, because the amplified output signal of U3 can also be returned immediately from the saturated state in response to the input signal returning to normal, the gain of U3 can be set higher, making it possible to eliminate the amplifying circuits of later stages (U14 in FIG. 6).

Moreover, in U3, the inverting input terminal and the non-inverting input terminal are of the FET input type, so the input impedances are extremely high, and thus the input signals are not attenuated. Furthermore, because the bias currents are extremely small, the production of insulating substances due to electrochemical reactions between the detecting electrodes TA and TB and the fluid interfaces are suppressed.

Although, at this time, L1 and L2 have high impedances, they are guarded by GR1 and GR2, and thus it is possible to suppress the adverse effects from other interconnection patterns and the adverse effects of from a breakdown of the insulation characteristics of the circuit board. Moreover, by disposing R1 and R2 in close proximity to the input terminals of U3 it is possible to minimize the effects of the degradation of the insulating properties of the circuit board and the effects from other interconnection patterns, even for an input terminal for U3 that has high impedance that is the same as for L1 and L2.

Another Example

Figure 4:
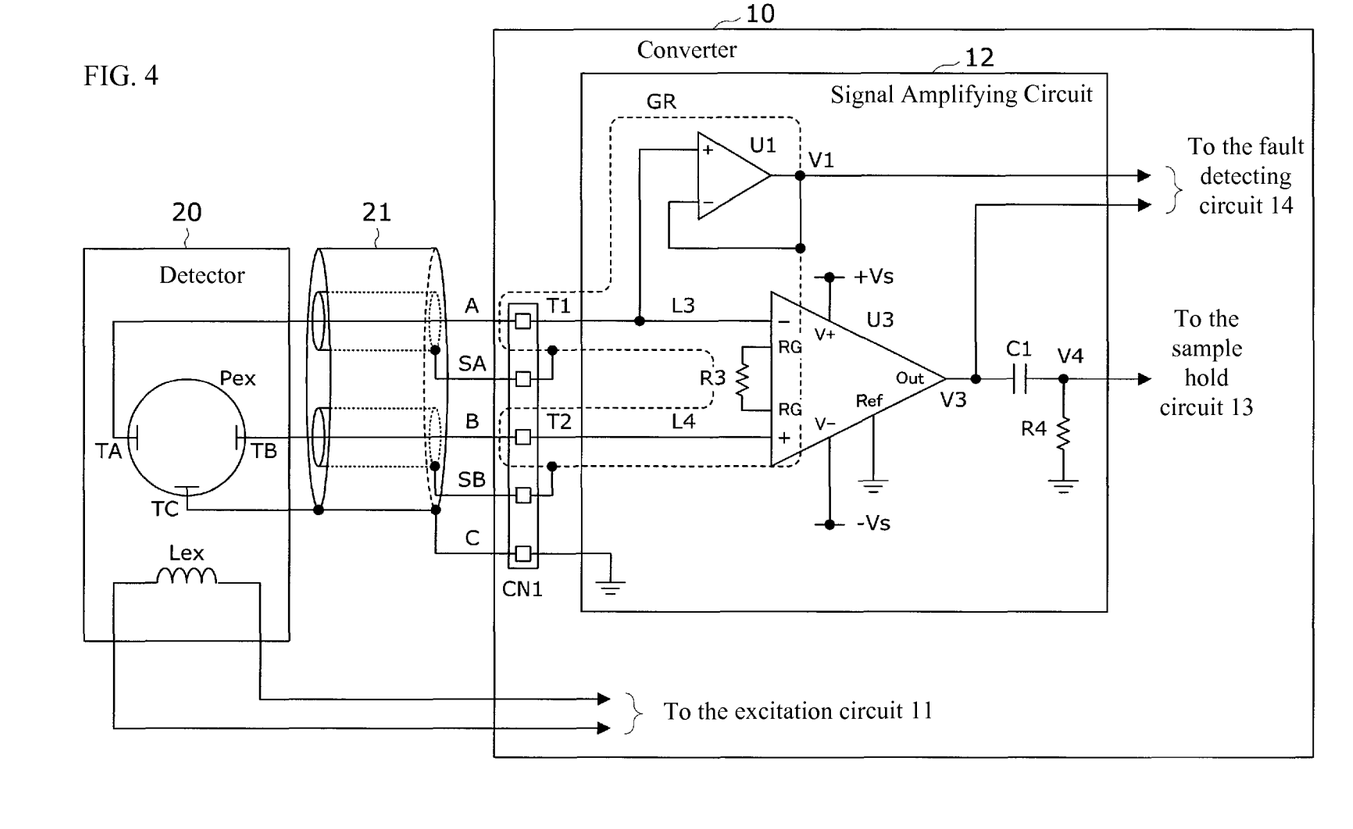
FIG. 4 is a circuit diagram illustrating a signal amplifying circuit according to Another Example.

Next an amplifying circuit 12 of an electromagnetic flow meter 1 according to Another Example according to the present invention will be explained in reference to FIG. 4. FIG. 4 is a circuit diagram illustrating a signal amplifying circuit according to the Another Example.

An example of a case wherein two buffer amplifiers, made from U1 and U2, were used to output the flow rate signal to the fault detecting circuit 14 was explained in the Example. In the present example, the explanation will be for a case wherein an amplified output signal is outputted to the fault detecting circuit 14 from U3 instead of U2.

In the present example, as illustrated in FIG. 4, U2 is omitted, and T2 of CN1 is connected to the non-inverting input terminal of U3. While here the input guard resistances R1 and R2 are omitted, R1 and R2 may instead be inserted, as illustrated in FIG. 2.

Moreover, the amplified output signal V3 of U3 is outputted to the fault detecting circuit 14. Note that V3 has a larger amplitude than that of the output signal V2 of U2 (the output signal V1 of U1), and thus the amplitude may be adjusted through resistive division on the fault detecting circuit 14 side. Conversely, the fault evaluation may be performed by the controlling circuit 16 after the output signal V1 of U1 and the amplified output signal V3 of U3 have undergone A/D conversion.

Moreover, the interconnection pattern L3 that connects T1, the non-inverting input terminal of U1, and the inverting input terminal of U3, and the interconnection pattern L4 that connects T2 and the inverting input terminal of U3, may both be guarded by a shared guard ring GR. In this case, the potential difference between the input signal levels T1 and T2 will be no more than several mV, at maximum, and thus even though L3 and L4 are guarded by a common GR, it will not be a problem.

Figure 5:
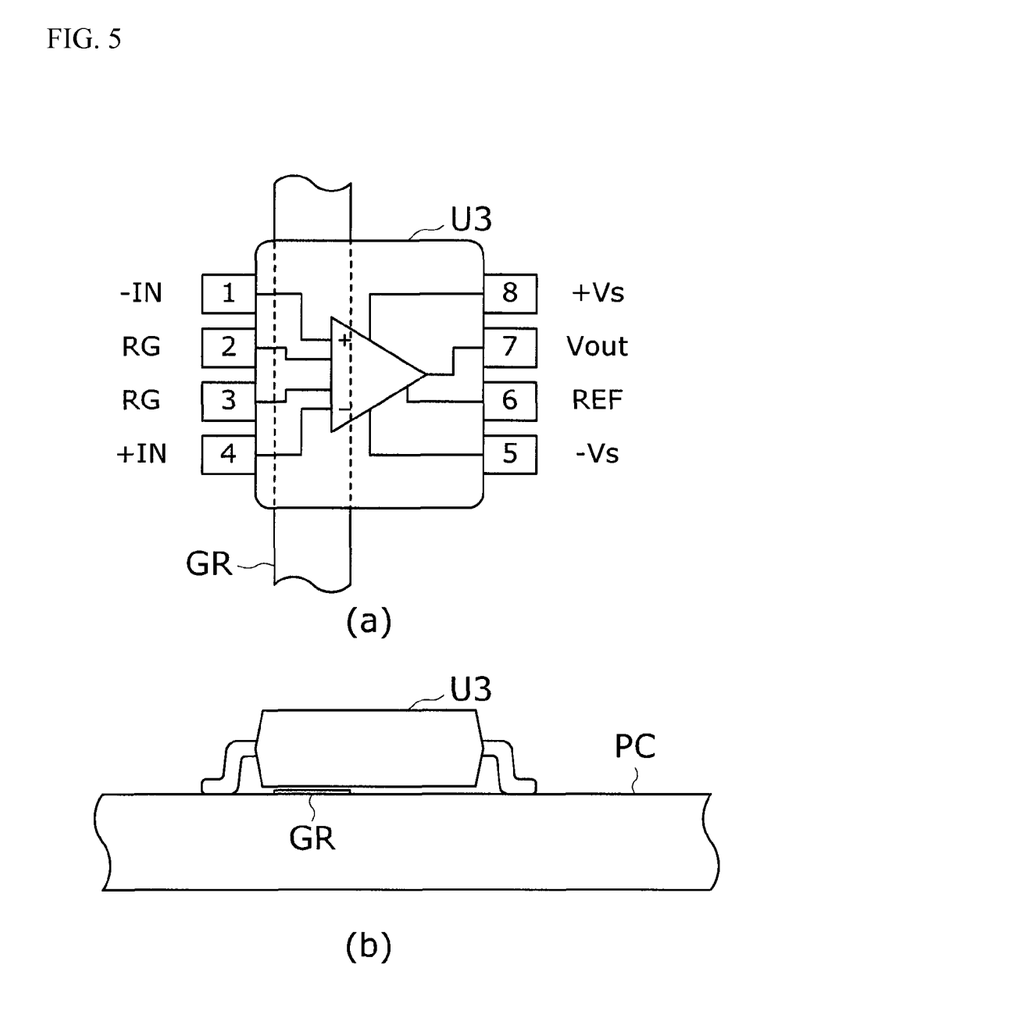
FIG. 5 is an example of formation of a guard ring pattern that uses an instrumentation amplifier.

FIG. 5 is an example of formation of a guard ring pattern that uses an instrumentation amplifier, where (a) is a plan view diagram and (b) is a front view diagram.

Although when L3 and L4 are guarded in common by the GR it is necessary to pass between the pins of U3, if a surface mount package is used for U3, the pin spacing will be narrow preventing GR from passing therethrough. Consequently, GR may be formed on the circuit board PC under U3, so as to pass under U3, which is mounted on the circuit board PC. In particular, in most instrumentation amplifiers the input-side and output-side terminals have pin assignments that are separated into the left and right rows of pins, and these can be used with the input-side 10 row surrounded by GR. Doing so makes it possible to form GR encompassing completely the high-impedance interconnection patterns L3 and L4, thus making it possible to suppress the adverse effects of other interconnection patterns and suppress the adverse effects of a breakdown of the insulation characteristics of the circuit board, including the input terminal of U3 as well.

Expanded Examples

While the present invention was explained above in reference to examples, the present invention is not limited by the examples set forth above. The structures and details of the present invention may be modified in a variety of ways, as can be understood by those skilled in the art, within the scope of the present invention. Moreover, the present invention may be embodied through combining the various examples, insofar as there are no contradictions.

The invention claimed is:

1. A signal amplifying circuit used in an electromagnetic flow meter, for measuring a flow rate of a fluid that flows in a pipe, through sampling, with a sample hold circuit, after differential amplification has been performed by a signal amplifying circuit, a flow rate signal that is detected by a pair of detecting electrodes that are disposed within the pipe, and inputted through first and second flow rate signal input terminals, and for detecting, through a fault detecting circuit, a fault in the flow rate signal based on the output signal obtained from the signal amplifying circuit, the signal amplifying circuit comprising:

a single-chip-type instrumentation amplifier with an FET input, with one input terminal connected to the first flow rate signal input terminal, and the other input terminal connected to the second flow rate signal input terminal, which outputs, to the sample hold circuit from the output terminal, an amplified output signal obtained through performing differential amplification on the flow rate signal;

a first buffer amplifier wherein a non-inverting input terminal is connected to the first flow rate signal input terminal, and the inverting input terminal is connected to its own output terminal, which outputs, from the output terminal to the fault detecting circuit, a first output signal that is produced;

a second buffer amplifier wherein a non-inverting input terminal is connected to the second flow rate signal input terminal, and the inverting input terminal is connected to its own output terminal, which outputs, from the output terminal to the fault detecting circuit, a second output signal that is produced;

a first guard ring pattern that is connected to an output terminal of the first buffer amplifier, formed on the circuit board so as to encompass a first interconnection pattern, on the circuit board, that connects the first flow rate signal input terminal and the non-inverting input terminal of the first buffer; and a second guard ring pattern that is connected to an output terminal of the second buffer amplifier, formed on the circuit board so as to encompass a second interconnection pattern, on the circuit board, that connects the second flow rate signal input terminal and the non-inverting input terminal of the second buffer.

2. The signal amplifying circuit as set forth in claim 1, wherein:

in the instrumentation amplifier, one input terminal is connected through a first resistive element to the first flow rate signal input terminal and the other input terminal is connected through a second resistive element to the second flow rate signal input terminal;

the first guard ring pattern is formed encompassing the periphery of the first interconnection pattern, passing under the first resistive element, which is mounted on the circuit board; and the second guard ring pattern is formed encompassing the periphery of the second interconnection pattern, passing under the second resistive element, which is mounted on the circuit board.

3. A signal amplifying circuit used in an electromagnetic flow meter, for measuring a flow rate of a fluid that flows in a pipe, through sampling, with a sample hold circuit, after differential amplification has been performed by a signal amplifying circuit, a flow rate signal that is detected by a pair of detecting electrodes that are disposed within the pipe, and inputted through first and second flow rate signal input terminals, and for detecting, through a fault detecting circuit, a fault in the flow rate signal based on the output signal obtained from the signal amplifying circuit, the signal amplifying circuit comprising:

a single-chip-type instrumentation amplifier with an FET input, with one input terminal connected to the first flow rate signal input terminal, and the other input terminal connected to the second flow rate signal input terminal, which outputs, to the sample hold circuit into the fault detecting circuit from the output terminal, an amplified output signal obtained through performing differential amplification on the flow rate signal;

a buffer amplifier wherein a non-inverting input terminal is connected to the first flow rate signal input terminal, and the inverting input terminal is connected to its own output terminal, which outputs, from the output terminal to the fault detecting circuit, a output signal that is produced; and a guard ring pattern that is connected to an output terminal of the buffer amplifier, formed on the circuit board so as to encompass a first interconnection pattern, on the circuit board, that connects the first flow rate signal input terminal, the non-inverting input terminal of the first buffer, and one input terminal of the instrumentation amplifier, and so as to encompass a second interconnection pattern, on the circuit board, that connects the second flow rate signal input terminal and the other input terminal of the instrumentation amplifier.

4. The signal amplifying circuit as set forth in claim 3, wherein:

in the instrumentation amplifier, one input terminal is connected directly to the first flow rate signal input terminal, and the other input terminal is connected directly to the second flow rate signal input terminal; and the guard ring pattern is formed encompassing the periphery of the first and second interconnection pattern, passing under the instrumentation amplifier, which is mounted on the circuit board.

\* \* \* \* \*